United States Patent
Park et al.

(10) Patent No.: US 11,048,431 B2
(45) Date of Patent: Jun. 29, 2021

(54) FLIP-FLOP BASED ON NONVOLATILE MEMORY AND BACKUP OPERATION METHOD THEREOF

(71) Applicant: KOREA UNIVERSITY RESEARCH AND BUSINESS FOUNDATION, Seoul (KR)

(72) Inventors: Jongsun Park, Seoul (KR); Gyuseong Kang, Yongin-si (KR)

(73) Assignee: Korea University Research and Business Foundation, Seoul (KR)

( * ) Notice: Subject to any disclaimer, the term of this patent is extended or adjusted under 35 U.S.C. 154(b) by 0 days.

(21) Appl. No.: 16/747,875

(22) Filed: Jan. 21, 2020

(65) Prior Publication Data

US 2020/0285394 A1    Sep. 10, 2020

(30) Foreign Application Priority Data

Mar. 8, 2019  (KR) .................. 10-2019-0027183

(51) Int. Cl.
*G11C 13/00* (2006.01)
*G06F 3/06* (2006.01)
*G11C 11/16* (2006.01)

(52) U.S. Cl.
CPC .......... *G06F 3/065* (2013.01); *G06F 3/0619* (2013.01); *G06F 3/0679* (2013.01); *G11C 11/161* (2013.01); *G11C 11/1673* (2013.01); *G11C 11/1675* (2013.01); *G11C 13/0061* (2013.01)

(58) Field of Classification Search
USPC ....................................... 365/148
See application file for complete search history.

(56) References Cited

U.S. PATENT DOCUMENTS

2013/0069964 A1*  3/2013  Wuu ................. G11C 13/0061
                                                        345/530

FOREIGN PATENT DOCUMENTS

| JP | 2016-129345 A | 7/2016 |
| KR | 10-1808409 B1 | 12/2017 |
| KR | 10-2018-0047398 A | 5/2018 |
| WO | WO 2013/035836 A1 | 3/2013 |

OTHER PUBLICATIONS

Korean Office Action dated May 21, 2020 in corresponding Korean Patent Application No. 10-2019-0027183 (6 pages in Korean).
Ali et al., "Energy- and Area-Efficient Spin—Orbit Torque Nonvolatile Flip-Flop for Power Gating Architecture," IEEE Transactions on Very Large Scale Integration (VLSI) Systems, vol. 26, No. 4, Apr. 30, 2018, pp. 630-638.

* cited by examiner

*Primary Examiner* — Jason Lappas
(74) *Attorney, Agent, or Firm* — NSIP Law

(57) ABSTRACT

Disclosed is a flip-flop based on a nonvolatile memory. The flip-flop based on the nonvolatile memory includes a flip-flop unit to output output data, a nonvolatile memory unit electrically connected to the flip-flop unit and to store backup data, and a backup controller to selectively control a backup operation for backing up the output data to the backup data, based on whether the backup data are the same as the output data.

16 Claims, 11 Drawing Sheets

FLIP-FLOP BASED ON NONVOLATILE MEMORY AND BACKUP OPERATION METHOD THEREOF

CROSS-REFERENCE TO RELATED APPLICATIONS

This U.S. non-provisional patent application claims priority under 35 U.S.C. § 119 of Korean Patent Application No. 10-2019-0027183, filed on Mar. 8, 2019, the entire contents of which are hereby incorporated by reference.

BACKGROUND

Embodiments of the inventive concept relate to a flip-flop based on a nonvolatile memory and a backup operation method thereof, and more particularly, relate to a flip-flop based on a nonvolatile memory that may skip a backup operation.

A latency time in a mobile device is much longer than a use time. Because of this, because an energy consumption of the mobile device due to a leakage power is large, a power-gating technique for turning off a power is being used in the mobile device.

In this case, in the power-gating technique, since the mobile device turns off the power applied to each of circuits, a flip-flop that is used to store a calculation result or a system state may lose corresponding data.

Accordingly, when the mobile device reapplies the power to the each of the circuits, to return to a state before a power down, data must be backed up prior to the power down, using the flip-flop based on a nonvolatile memory.

In this case, the flip-flop based on the nonvolatile memory stores the data through an emerging memory device such as a STT-MRAM and a ReRAM, which may be integrated with a CMOS circuit. In more detail, since the emerging memory device discriminates the data, based on a magnitude of resistance, two elements store the data as a high resistance (RH) and a low resistance (RL), respectively. Restoring the data to the flip-flop may be implemented through a differential sensing technique using the two elements.

However, there is a problem in that the energy that is consumed to write the data in the emerging memory device is large, and the flip-flop based on the nonvolatile memory is required to solve this problem.

SUMMARY

Embodiments of the inventive concept provide a flip-flop based on a nonvolatile memory and a backup operation method thereof, which may decrease a power consumed by a backup operation by skipping the backup operation when output data are the same as backup data.

According to an exemplary embodiment, a flip-flop based on a nonvolatile memory includes a flip-flop unit to output output data, a nonvolatile memory unit electrically connected to the flip-flop unit and to store backup data, and a backup controller to selectively control a backup operation for backing up the output data to the backup data, based on whether the backup data are the same as the output data.

In an embodiment, the backup controller allows the backup operation to be skipped when the output data are the same as the backup data.

In an embodiment, the nonvolatile memory unit includes a first MTJ element to receive a first node voltage corresponding to the output data from the flip-flop unit, and a second MTJ element to receive a second node voltage corresponding to the output data from the flip-flop unit.

In an embodiment, the backup controller includes a sensing circuit unit connected in series between the first and second MTJ elements and to sense first and second sensing voltages divided from the first and second node voltages, and a signal generator to selectively output a backup activation signal, based on a voltage difference between the first and second sensing voltages.

In an embodiment, the sensing circuit unit generates a determination signal indicating whether the backup data are the same as the output data, based on the voltage difference between the first and second sensing voltages.

In an embodiment, the sensing circuit unit generates the determination signal as a high potential voltage signal when the voltage difference between the first and second sensing voltages is less than a preset magnitude, and generates the determination signal as a low potential voltage signal when the voltage difference between the first and second sensing voltages is equal to or greater than the preset magnitude.

In an embodiment, the signal generator generates the backup activation signal when the determination signal is the low potential voltage signal, and does not generate the backup activation signal when the determination signal is the high potential voltage signal.

In an embodiment, the sensing circuit unit includes a first sensing transistor positioned in series between the first and second MTJ elements, a second sensing transistor having a gate connected to a drain of the first sensing transistor, a third sensing transistor having a gate connected to a source of the first sensing transistor, and a fourth transistor positioned between a source of the third sensing transistor and a ground power source.

In an embodiment, the first sensing transistor and the first and second MTJ elements are voltage dividing circuit that divides the first and second node voltages into the first and second sensing voltages.

In an embodiment, the first sensing transistor connects the first and second MTJ elements to each other, based on a check signal, and the check signal corresponds to a falling edge of a write drive signal for driving a write driver.

In an embodiment, the first sensing transistor is a PMOS transistor, and the second to fourth sensing transistors are NMOS transistors.

In an embodiment, the signal generator includes a first signal transistor having a gate connected to a determination node that is positioned between the second and third sensing transistors, a second signal transistor positioned between the first signal transistor and a driving power source, and a third signal transistor positioned between the first signal transistor and a driving power source.

In an embodiment, the first signal transistor connects the second signal transistor to the third signal transistor, based on a determination signal applied through the determination node.

In an embodiment, the first and second signal transistors are NMOS transistors, and the third signal transistor is a PMOS transistor.

In an embodiment, the first and second MTJ elements are implemented as a resistive memory device of at least one of a spin-torque transfer (STT), a spin-orbit torque (SOT), a phase change RAM (PRAM), a nano floating gate memory (NFGM), a resistance RAM (ReRAM), a polymer RAM (PoRAM), a MRAM (magnetic RAM), and a molecular electronic device.

According to an exemplary embodiment, an operating method of a flip-flop based on a nonvolatile memory includes outputting, by a flip-flop unit, output data, receiving, by a nonvolatile memory unit, first and second node voltages corresponding to the output data, determining, by a backup controller, whether the output data are the same as backup data stored in the nonvolatile memory unit, based on the first and second node voltages, and selectively outputting, by the backup controller, a backup activation signal, based on whether the output data are the same as the backup data.

In an embodiment, the receiving further includes receiving, by a first MTJ element of the nonvolatile memory unit, the first node voltage from the flip-flop unit, and receiving, by a second MTJ element of the nonvolatile memory unit, the second node voltage from the flip-flop unit.

In an embodiment, the determining includes sensing first and second sensing voltages of which the first and second node voltages are divided through a first sense transistor connected in series between the first and second MTJ elements, and generating a determination signal indicating whether the output data are the same as the backup data, based on a voltage difference between the first and second sensing voltages.

In an embodiment, the generating of the determination signal includes generating the determination signal as a high potential voltage signal when the voltage difference between the first and second sensing voltages is less than a preset voltage magnitude, and generating the determination signal as a low potential voltage signal when the voltage difference between the first and second sensing voltages is equal to or greater than the preset voltage magnitude.

In an embodiment, the selectively outputting of the backup activation signal includes outputting the backup activation signal when the determination signal is a high potential, and non-outputting the backup activation signal when the determination signal is a low potential.

BRIEF DESCRIPTION OF THE FIGURES

The above and other objects and features of the inventive concept will become apparent by describing in detail exemplary embodiments thereof with reference to the accompanying drawings.

DETAILED DESCRIPTION

Figure 1:
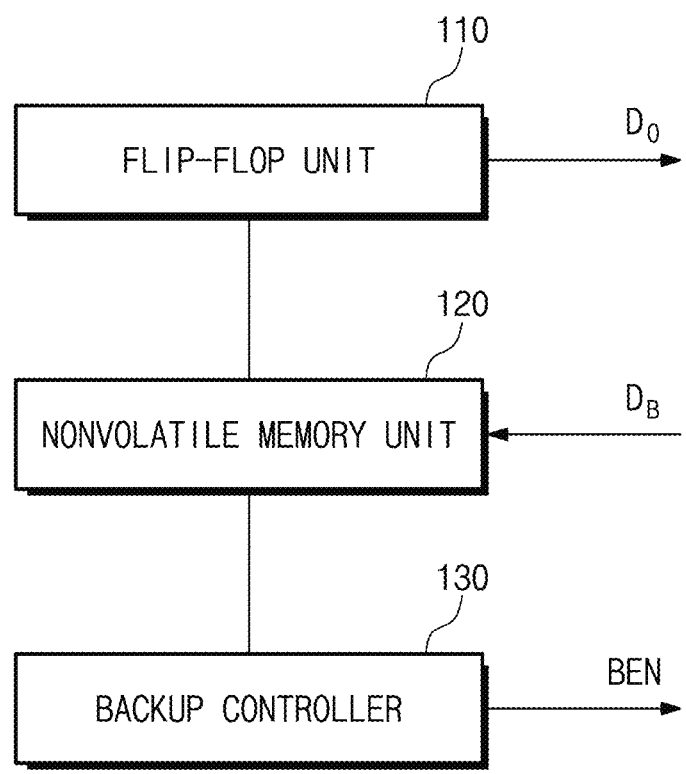
FIG. 1 is a block diagram illustrating a flip-flop based on a nonvolatile memory according to an embodiment of the inventive concept.

Specific structural or functional descriptions of the embodiments in accordance with the inventive concept disclosed herein are merely for the purpose of describing embodiments in accordance with the inventive concept. Embodiments according to the inventive concept may be embodied in various forms and are not limited to the embodiments described herein.

As embodiments according to the inventive concept may have various modifications and may have various forms, the embodiments will be illustrated in the drawings and described in detail herein. However, this is not intended to limit the embodiments in accordance with the inventive concept to specific disclosure forms, and includes all changes, equivalents, or substitutes included in the spirit and scope of the inventive concept.

Terms such as first or second may be used to describe various components, but the components should not be limited by the terms. The terms are used only for the purpose of distinguishing one component from another, for example, without departing from the scope of rights in accordance with the inventive concept, the first component may be referred to as a second component, and likewise, the second component may also be referred to as the first component.

When a component is referred to as being "connected" or "coupled" to another component, it may be directly connected to or coupled to that other component, but it should be understood that other components may be present in therebetween. On the other hand, when a component is said to be "directly connected" or "directly coupled" to another component, it should be understood that there is no other component in therebetween. Other expressions describing the relationship between components, such as "between" and "immediately between" or "neighboring to" and "directly neighboring", should be interpreted as well.

The terminology used herein is for the purpose of describing particular example embodiments only and is not intended to be limiting of the inventive concept. Singular expressions include plural expressions unless the context clearly indicates otherwise. As used herein, the terms "comprise" or "have" are intended to indicate that there is a feature, number, step, operation, component, part, or combination thereof that is implemented, and that one or more other features or numbers are present. It should be understood that it does not exclude in advance the possibility of the presence or addition of one or more other features or numbers, steps, operations, components, parts or combinations thereof.

Unless defined otherwise, all terms used herein, including technical or scientific terms, have the same meaning as commonly understood by one of ordinary skill in the art to which this application belongs. Terms such as those defined in commonly used dictionaries should be interpreted as having meanings consistent with the meanings in the context of the related art, unless expressly defined herein, they are not to be interpreted in an ideal or overly formal sense.

Hereinafter, embodiments of the inventive concept will be described in more detail with reference to the accompanying drawings.

FIG. 1 is a block diagram illustrating a flip-flop 100 based on a nonvolatile memory according to an embodiment of the inventive concept.

Referring to FIG. 1, the flip-flop 100 based on a nonvolatile memory may include a flip-flop unit 110, a nonvolatile memory unit 120, and a backup controller 130.

First, the flip-flop unit 110 may receive input data $D_{IN}$ and a clock frequency CK in a power gating operation. In this case, the power gating operation may be a series of operation processes for turning off a power in a sleep mode.

In detail, the flip-flop unit 110 may generate output data $D_O$, based on the input data $D_{IN}$ and the clock frequency CK. In this case, the flip-flop unit 110 may include at least one latch for holding or changing the input data $D_{IN}$ to the output data $D_O$, based on the clock frequency CK.

In addition, the nonvolatile memory unit 120 may be electrically connected to the flip-flop unit 110 and store the backup data $D_b$. For example, the nonvolatile memory unit 120 may be a nonvolatile memory that electrically read, write, and erase the data, and may maintain stored backup data $D_b$ even when there is no power supply.

In addition, the backup controller 130 may selectively control a backup operation for backing up the output data $D_O$ to the backup data $D_b$, based on whether the backup data $D_b$ are the same as the output data $D_O$. In this case, the backup operation may mean an operation of copying the output data $D_O$ to the backup data $D_b$.

For example, the backup controller 130 may selectively output a backup activation signal $B_{EN}$ to a write driver, based on whether the backup data $D_b$ are the same as the output data $D_O$. Here, the backup activation signal $B_{EN}$ may be a control signal for controlling the write driver that performs the backup operation.

That is, the backup controller 130 may allow the backup operation to be skipped, based on whether the backup data $D_b$ are the same as the output data $D_O$. In detail, when the backup data $D_b$ are the same as the output data $D_O$, the backup controller 130 may allow the backup operation to be skipped. When the backup data $D_b$ are not the same as the output data $D_O$, the backup controller 130 may allow the backup operation to be performed.

In particular, in an embodiment according to a subject matter of the inventive concept, when the backup data $D_b$ and the output data $D_O$ are different data from each other, the flip-flop 100 based on the nonvolatile memory may allow the backup controller 130 to selectively perform the backup operation. Therefore, a power consumption consumed in a conventional flip-flop which backs up the output data $D_O$ to the nonvolatile memory as the backup data $D_b$ may be significantly decreased.

Hereinafter, the flip-flop unit 110, the nonvolatile memory unit 120, and the backup controller 130 will be described in more detail.

Figure 2:
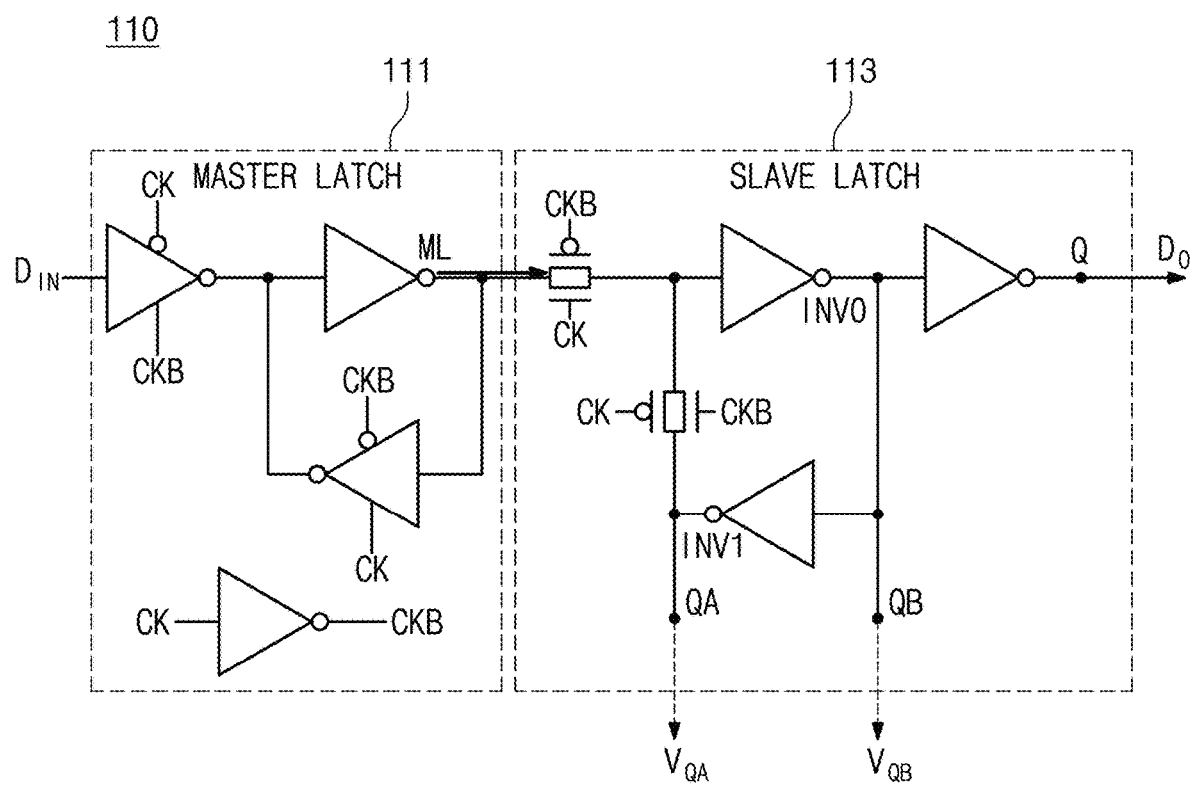
FIG. 2 is a diagram illustrating an embodiment of a flip-flop unit of FIG. 1.

FIG. 2 is a diagram illustrating an embodiment of the flip-flop unit 110 of FIG. 1.

Referring to FIGS. 1 and 2, the flip-flop unit 110 may include a master latch 111 and a slave latch 113.

First, the master latch 111 may generate a delay frequency CKB by delaying the clock frequency CK among the input data Dm and the clock frequency CK that are received in the power gating operation. In this case, the master latch 111 may output a master latch output signal ML to the slave latch 113, based on the input data $D_{IN}$, the clock frequency CK, and the delay frequency CKB.

In addition, the slave latch 113 is electrically connected to the master latch 111, and may output the output data $D_O$ through an output node Q, based on the master latch output signal ML, the clock frequency CK, and the delay frequency CKB.

In more detail, the slave latch 113 may electrically be connected to one side of the nonvolatile memory unit 120 through a first node QA, and electrically be connected to the other side of the nonvolatile memory unit 120 through a second node QB. For example, a first MTJ element 121_1 to be described below may be located at the one side of the nonvolatile memory unit 120, and a second MTJ element 121_2 to be described below may be located at the other side of the nonvolatile memory unit 120.

In this case, the slave latch 113 may apply a first node voltage $V_{QA}$ to the one side of the nonvolatile memory unit 120 through the first node QA, and apply a second node voltage $V_{QB}$ to the other side of the nonvolatile memory unit 120 through the second node QB. Here, the first and second node voltages QA and QB may be an input power for output data $D_O$ that are switched to each other, based on the input data $D_{IN}$.

Hereinafter, the nonvolatile memory unit 120 will be described in more detail with reference to FIG. 3.

Figure 3:
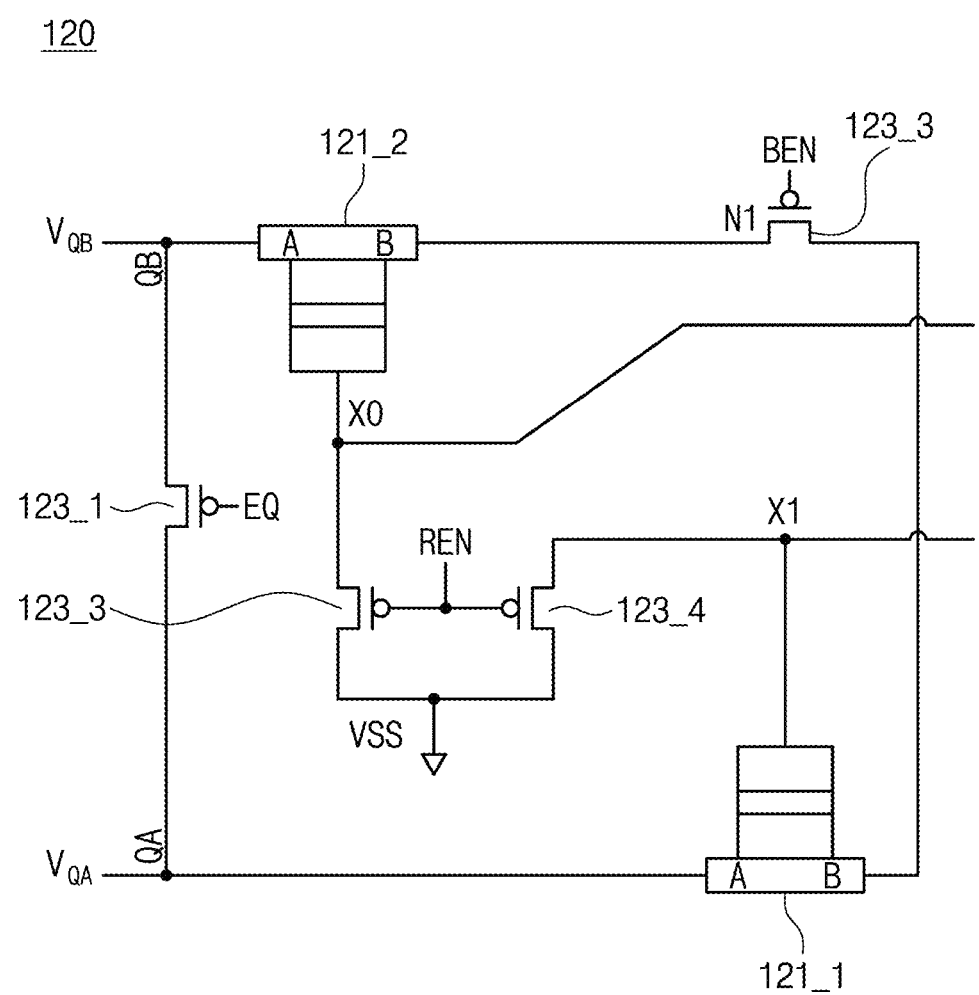
FIG. 3 is a diagram illustrating an embodiment of a nonvolatile memory unit of FIG. 1.

FIG. 3 is a diagram illustrating an embodiment of a nonvolatile memory unit 120 of FIG. 1.

Referring to FIGS. 1 to 3, the nonvolatile memory unit 120 may include the first and second MTJ elements 121_1 and 121_2 and first to fourth transistors 123_1 to 123_4.

First, the first and second MTJ elements 121_1 and 121_2 may receive the first and second node voltages $V_{QA}$ and $V_{QB}$ corresponding to the output data $D_O$ from the slave latch 113. In detail, the first MTJ element 121_1 may receive the first node voltage $V_{QA}$ corresponding to the output data $D_O$, and the second MTJ element 121_2 may receive the second node voltage $V_{QB}$ corresponding to the output data $D_O$. That is, the nonvolatile memory unit 120 may receive the first and second node voltages $V_{QA}$ and $V_{QB}$ through the first and second MTJ elements 121_1 and 121_2.

For example, each of the first and second MTJ elements 121_1 and 121_2 may have a sandwich structure that includes a metal layer, a free layer made of a ferromagnetic material adjacent to the metal layer, a pinned layer made of the ferromagnetic material like the free layer, and an insulating layer located between the free layer and the pinned layer.

The first and second MTJ elements 121_1 and 121_2 may receive the first and second node voltages $V_{QA}$ and $V_{QB}$ through the metal layer that is electrically connected to the slave latch 113. In more detail, when a current that corresponds to the first and second node voltages $V_{QA}$ and $V_{QB}$ passes through a ferromagnetic layer/the insulating layer/the ferromagnetic layer, the first and second MTJ elements 121_1 and 121_2 may have different resistance components depending on a magnetization arrangement state of the ferromagnetic layer. In this case, unlike the pinned layer having a pinned magnetization arrangement, the magnetization arrangement state of the free layer may be changed depending on a specific write current.

In an embodiment, the first and second MTJ elements 121_1 and 121_2 are described as the memory device of the magnetic RAM (MRAM), but the inventive concepts are not limited thereto, and the first and second MTJ elements 121_1 and 121_2 according to embodiments may be implemented as first and second resistive memory devices.

That is, the first and second MTJ elements 121_1 and 121_2 may be implemented as the resistive memory device of at least one of a spin-torque transfer (STT), a spin-orbit torque (SOT), a phase change RAM (PRAM), a nano floating gate memory (NFGM), a resistance RAM (ReRAM), a polymer RAM (PoRAM), a MRAM (magnetic RAM), and a molecular electronic device, are not limited to embodiments and examples described herein.

In addition, the first to fourth transistors 123_1 to 123_4 may directly or indirectly connect the first and second MTJ elements 121_1 and 121_2 in series or in parallel.

In detail, the first transistor 123_1 may connect one side of the metal layer of the first MTJ element 121_1 and one side of the metal layer of the second MTJ element 121_2 to each other in series. That is, the first and second MTJ elements 121_1 and 121_2 may be connected in series to each other through the first transistor 123_1 at the one side of each metal layer.

In addition, the second transistor 123_2 may connect the other side of the metal layer of the first MTJ element 121_1 and the other side of the metal layer of the second MTJ element 121_2 to each other in series. That is, the first and second MTJ elements 121_1 and 121_2 may be connected in series to each other through the second transistor 123_2 at the other side of the each metal layer.

In addition, the third transistor 123_3 may connect the ferromagnetic layer of the first MTJ element 121_1 to a ground power source VSS. In this case, a first sensing node X1 may be located between a drain of the third transistor 123_3 and the ferromagnetic layer of the first MTJ element 121_1.

In addition, the fourth transistor 123_4 may connect the ferromagnetic layer of the second MTJ element 121_2 to the ground power source VSS. In this case, a second sensing node X0 may be located between a drain of the fourth transistor 123_4 and the ferromagnetic layer of the second MTJ element 121_2.

Figure 4:
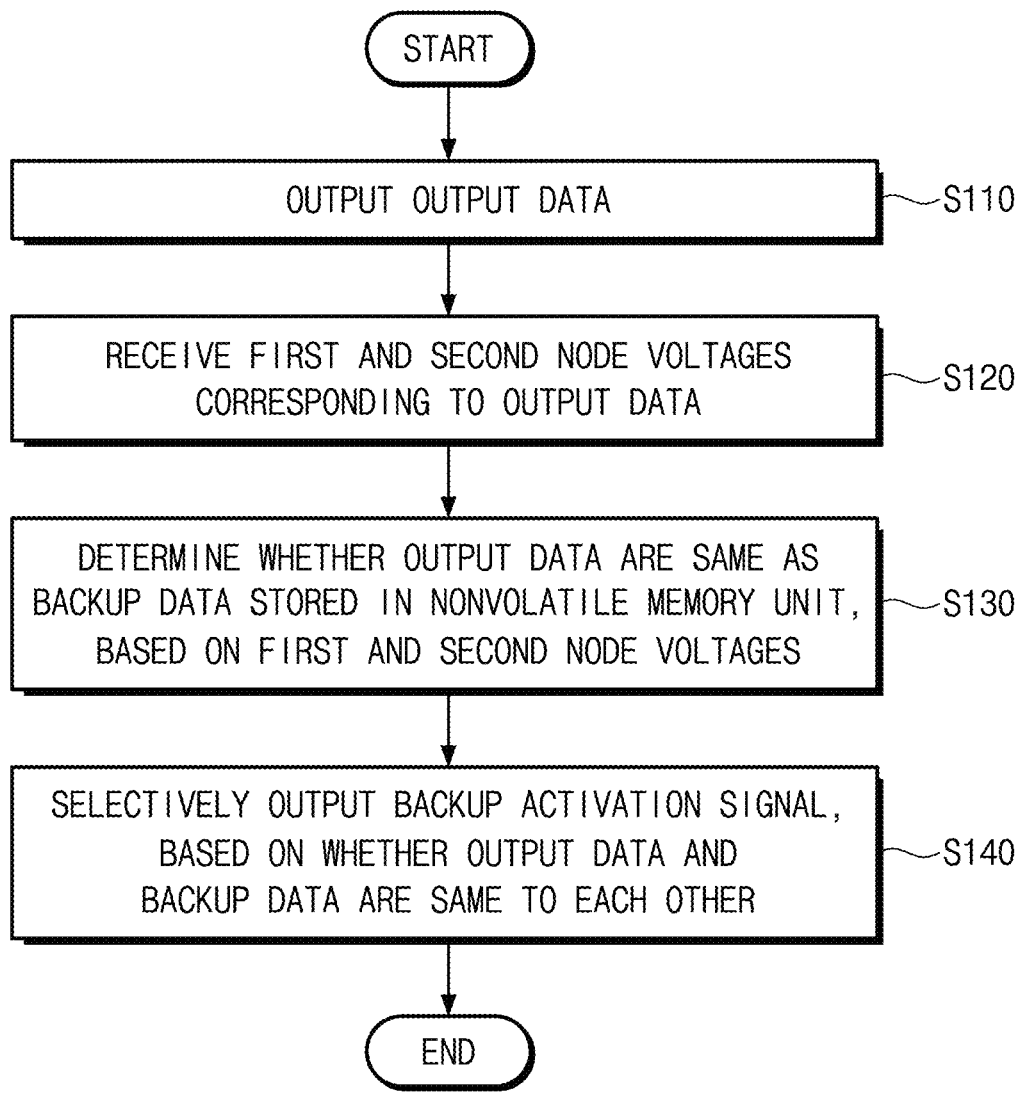
FIG. 4 is a flowchart describing an operation process of a flip-flop based on a nonvolatile memory of FIG. 1.

FIG. 4 is a flowchart describing an operation process of the flip-flop 100 based on a nonvolatile memory of FIG. 1.

Referring to FIGS. 1 to 4, first, in operation S110, the flip-flop unit 110 may output the output data $D_O$.

In addition, in operation S120, the nonvolatile memory unit 120 may receive the first and second node voltages $V_{QA}$ and $V_{QB}$ corresponding to the output data $D_O$ from the flip-flop unit 110. Specifically, the first MTJ element 121_1 may receive the first node voltage $V_{QA}$ corresponding to the output data $D_O$ from the flip-flop unit 110, and the second MTJ element 121_2 may receive the second node voltage $V_{QB}$ corresponding to the output data $D_O$ from the flip-flop unit 110.

In addition, in operation S130, the backup controller 130 may determine whether the output data $D_O$ are the same as the backup data $D_b$ that are stored in the nonvolatile memory unit 120, based on the first and second node voltages $V_{QA}$ and $V_{QB}$. In detail, a sensing circuit unit 131 may receive the first and second node voltages $V_{QA}$ and $V_{QB}$ through the nonvolatile memory unit 120, and then determine whether the output data $D_O$ are the same as the backup data $D_b$ that are stored in the nonvolatile memory unit 120.

Subsequently, in operation S140, the backup controller 130 may selectively output the backup activation signal $B_{EN}$ to the write driver, based on whether the output data $D_O$ and the backup data $D_b$ are the same to each other.

Figure 5:
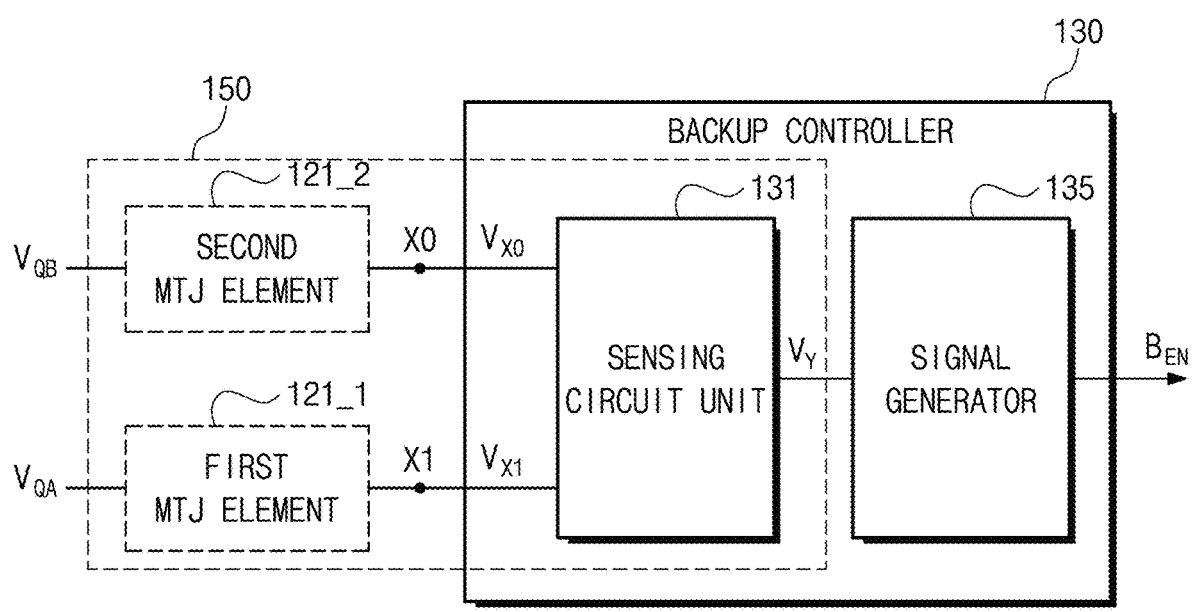
FIG. 5 is a block diagram illustrating a backup controller of FIG. 1.
Figure 6:
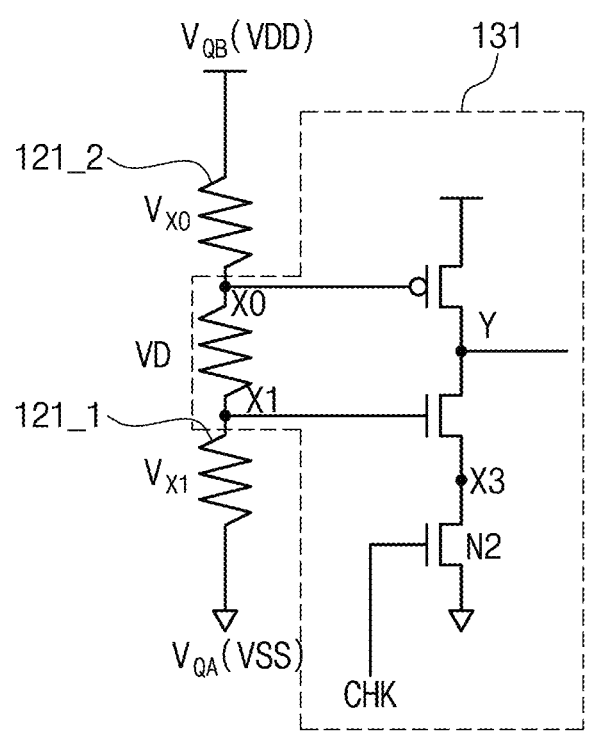
FIG. 6 is a diagram illustrating in detail a voltage dividing circuit of FIG. 5.

FIG. 5 is a block diagram illustrating the backup controller 130 of FIG. 1, and FIG. 6 is a diagram illustrating in detail a voltage dividing circuit 150 of FIG. 5.

Referring to FIGS. 1, 5, and 6, the backup controller 130 may include the sensing circuit unit 131 and a signal generator 135.

First, the sensing circuit unit 131 is connected in series between the first and second MTJ elements 121_1 and 121_2, and may sense first and second sensing voltages $V_{X1}$ and $V_{X0}$ that are divided through the first and second sensing nodes X1 and X0 from the first and second node voltages $V_{QA}$ and $V_{QB}$.

In detail, the sensing circuit unit 131 may be electrically connected to each ferromagnetic layer of the first and second MTJ elements 121_1 and 121_2 in series through the first and second sensing nodes X1 and X0 of the nonvolatile memory unit 120. In this case, the sensing circuit unit 131 may form the voltage dividing circuit 150 through a series connection with the first and second MTJ elements 121_1 and 121_2.

As illustrated in FIG. 6, the sensing circuit unit 131 may be connected in series between the first and second sensing nodes X1 and X0. In this case, as the first and second node voltages $V_{QA}$ and $V_{QB}$ are applied to the nonvolatile memory unit 120, the sensing circuit unit 131 may sense a voltage difference VD between the first and second sensing voltages $V_{X1}$ and $V_{X0}$ that are divided through the first and second sensing nodes X1 and X0.

For example, since the first and second node voltages $V_{QA}$ and $V_{QB}$ may be input power sources VDD and VSS for the nonvolatile memory unit 120, the sensing circuit unit 131 that is connected in series between the first and second sensing nodes X1 and X0 may sense the first sensing voltage $V_{X1}$ of the first sensing node X1 which is voltage-dropped through the first MTJ element 111. In addition, the sensing circuit unit 131 may sense the second sensing voltage $V_{X0}$ of the second sensing node X0 that is voltage-dropped through the second MTJ element 113.

That is, the sensing circuit unit 131 is electrically connected to the nonvolatile memory unit 120 through the first and second sensing nodes X1 and X0, and may sense the voltage difference VD between the first and second sensing voltages $V_{X1}$ and $V_{X0}$ that are voltage-divided through the first and second sensing nodes X1 and X0 due to applying of first and second node voltages $V_{QA}$ and $V_{QB}$.

In addition, the sensing circuit unit 131 may generate a determination signal $V_Y$ in response to the voltage difference VD between the first and second sensing voltages $V_{X1}$ and $V_{X0}$. The determination signal $V_Y$ may be a signal indicating whether the output data $D_O$ of the flip-flop unit 110 are the same as the backup data $D_b$ of the nonvolatile memory unit 120.

The sensing circuit unit 131 according to an embodiment may generate the determination signal $V_Y$ having different potential levels depending on the voltage difference VD between the first and second sensing voltages $V_{X1}$ and $V_{X0}$.

In more detail, when the voltage difference VD between the first and second sensing voltages $V_{X1}$ and $V_{X0}$ is equal to or greater than a preset magnitude, the sensing circuit unit 131 may generate the determination signal $V_Y$ as a voltage signal having a low potential level. In addition, when the voltage difference VD between the first and second sensing voltages $V_{X1}$ and $V_{X0}$ is less than the preset magnitude, the sensing circuit unit 131 may generate the determination signal $V_Y$ as a voltage signal having a high potential level.

For example, when the determination signal $V_Y$ is the voltage signal of the high potential level, the output data $D_O$ of the flip-flop unit 110 and the backup data $D_b$ of the nonvolatile memory unit 120 may represent the same data. Further, when the determination signal $V_Y$ is the voltage signal of the low potential level, the output data $D_O$ of the flip-flop unit 110 and the backup data $D_b$ of the nonvolatile memory unit 120 may represent data that are not same to each other.

In addition, the signal generator 135 may selectively output the backup activation signal $B_{EN}$, based on the voltage difference VD between the first and second sensing voltages $V_{X1}$ and $V_{X0}$. Here, the backup activation signal $B_{EN}$ may be a control signal for the write driver to selectively perform the backup operation. For example, as the write driver performs a backup operation of backing up the output data $D_O$ to the backup data $D_b$, based on the backup activation signal $B_{EN}$, the nonvolatile memory unit 120 may store the output data $D_O$ of the flip-flop unit 110 as backup data $D_b$.

In detail, the signal generator 135 may selectively output the backup activation signal $B_{EN}$, based on the potential level of the determination signal $V_Y$ that is generated in dependence on the voltage difference VD between the first and second sensing voltages $V_{X1}$ and $V_{X0}$.

For example, when the determination signal $V_Y$ that is generated in dependence on the voltage difference VD between the first and second sensing voltages $V_{X1}$ and $V_{X0}$ is a low potential voltage signal, the signal generator 135 may output the backup activation signal $B_{EN}$ to the write driver. In addition, when the determination signal $V_Y$ that is generated in dependence on the voltage difference VD between the first and second sensing voltages $V_{X1}$ and $V_{X0}$ is a high potential voltage signal, the signal generator 135 may not output the backup activation signal $B_{EN}$ to the write driver.

Hereinafter, the backup controller 130 will be described in more detail with reference to FIG. 7.

Figure 7:
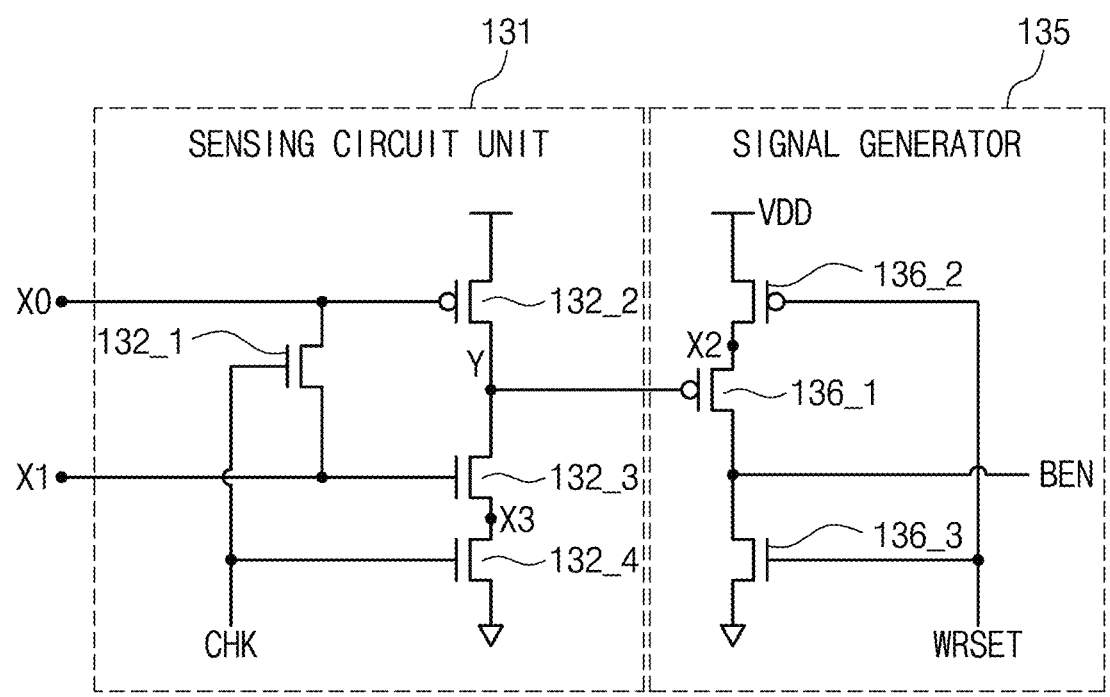
FIG. 7 is a diagram illustrating in detail a backup controller of FIG. 5.

FIG. 7 is a diagram illustrating in detail the backup controller 130 of FIG. 5.

Referring to FIGS. 5 to 7, the sensing circuit unit 131 may include first to fourth sensing transistors 132_1 to 132_4.

First, the first sensing transistor 132_1 may be located between the first and second sensing nodes X1 and X0. In this case, the first sensing transistor 132_1 may connect the first and second sensing nodes X1 and X0 to each other, based on a check signal CHK.

In this case, the check signal CHK may be a signal corresponding to a falling edge of a write driving signal WRSET, and the write driving signal WRSET may be a signal for driving the write driver. For example, when the check signal CHK corresponds to a HIGH state that is activated, the first sensing transistor 132_1 may be an NMOS transistor that connects the first and second sensing nodes X1 and X0 to each other.

In addition, the second sensing transistor 132_2 may be located between a driving power supply VDD and a determination node Y. Here, the determination node Y may be an output node of the sensing circuit unit 131 that is connected to the signal generator 135, to apply the determination signal $V_Y$ to the signal generator 135. In this case, the determination node Y may be connected to a drain side of the second sensing transistor 132_2 and may be connected to a drain side of the third sensing transistor 132_3.

In this case, the second sensing transistor 132_2 may connect the driving power supply VDD and the determination node Y to each other, based on the first sensing voltage $V_{X1}$. For example, when the first sensing voltage $V_{X1}$ corresponds to a LOW state that is less than a preset voltage magnitude, the second sensing transistor 132_2 may be a PMOS transistor that connects the driving power supply VDD and the determination node Y to each other.

In addition, the third sensing transistor 132_3 may be located between the determination node Y and the fourth sensing transistor 132_4. In this case, the third sensing transistor 132_3 may connect the determination node Y and a drain side of the fourth sensing transistor 132_4 to each other, based on the second sensing voltage $V_{X0}$. For example, when the second sensing voltage $V_{X0}$ corresponds to a HIGH state of a preset voltage magnitude or more, the third sensing transistor 132_3 may be an NMOS transistor that connects the determination node Y and the drain side of the fourth sensing transistor 132_4 to each other.

In addition, the fourth sensing transistor 132_4 may be located between the third sensing transistor 132_3 and the ground power source VSS. In this case, the fourth sensing transistor 132_4 may connect a source side of the third sensing transistor 132_3 and the ground power source VSS to each other, based on the check signal CHK. For example, when the check signal CHK corresponds to the HIGH state that is activated, the fourth sensing transistor 132_4 may be an NMOS transistor that connects the source side of the third sensing transistor 132_3 and the ground power source VSS to each other.

In addition, the signal generator 135 may include first to third signal transistors 136_1 to 136_3.

First, the first signal transistor 136_1 may be located between the second signal transistor 136_2 and the third signal transistor 136_3, and a gate of the first signal transistor 136_1 may be connected to the determination node Y. In this case, the first signal transistor 136_1 may connect the second signal transistor 136_2 and the third signal transistor 136_3 to each other, based on the determination signal $V_Y$ that is received through the determination node Y. In detail, when the determination signal $V_Y$ has a low potential close to 0V, the first signal transistor 136_1 may be a PMOS transistor that connects the second signal transistor 136_2 and the third signal transistor 136_3 to each other.

In addition, the second signal transistor 136_2 may be located between the driving power supply VDD and the first signal transistor 136_1 and connect the driving power supply VDD and a source side of the first signal transistor 136_1 to each other, based on the write driving signal WRSET. In detail, when the write driving signal WRSET is '0', the second signal transistor 136_2 may be a PMOS transistor that connects the driving power supply VDD and the source side of the first signal transistor 136_1 to each other.

In addition, the third signal transistor 136_3 may be located between the first signal transistor 136_1 and the ground power source VSS and may connect a drain side of the first signal transistor 136_1 and the ground power source VSS to each other, based on the write driving signal WRSET. In detail, when the write driving signal WRSET is '1', the third signal transistor 136_3 may be an NMOS transistor that connects the drain side of the first signal transistor 136_1 and the ground power source VSS to each other.

Figure 8:
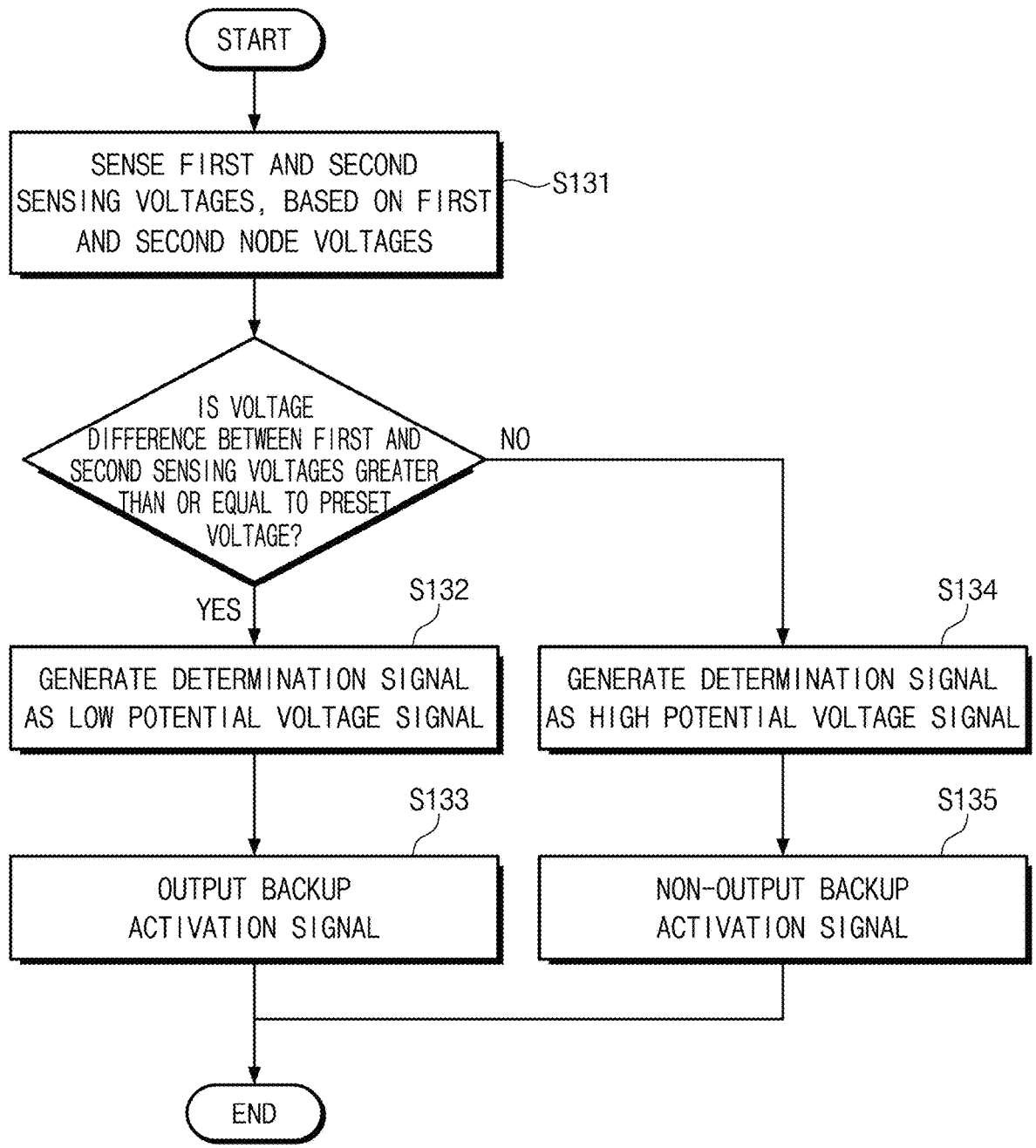
FIG. 8 is a flowchart describing an operation process of a backup controller of FIG. 5.

FIG. 8 is a flowchart describing an operation process of the backup controller 130 of FIG. 5.

Referring to FIGS. 5 to 8, first, in operation S131, the sensing circuit unit 131 may sense the first and second sensing voltages $V_{X1}$ and $V_{X0}$ in which the first and second node voltages $V_{QA}$ and $V_{QB}$ are voltage-divided, respectively, through the first sensing transistor 132_1 that is connected in series between the first and second MTJ elements 121_1 and 121_2.

In this case, the sensing circuit unit 131 may generate the determination signal $V_Y$ indicating whether the output data $D_O$ are the same as the backup data $D_b$, based on the voltage difference VD between the first and second sensing voltages $V_{X1}$ and $V_{X0}$.

In detail, when the voltage difference VD between the first and second sensing voltages $V_{X1}$ and $V_{X0}$ is greater than or equal to the preset voltage magnitude, in operation S132, the sensing circuit unit 131 may generate the determination signal $V_Y$ as the low potential voltage signal.

Thereafter, when the determination signal $V_Y$ is the low potential voltage signal, in operation S133, the signal generator 135 may output the backup activation signal $B_{EN}$ to the write driver.

Meanwhile, when the voltage difference VD between the first and second sensing voltages $V_{X1}$ and $V_{X0}$ is less than the preset voltage magnitude, in operation S134, the sensing circuit unit 131 may generate the determination signal $V_Y$ as the high potential voltage signal.

Thereafter, in operation S135, when the determination signal $V_Y$ is the high potential voltage signal, the signal generator 135 may not output the backup activation signal $B_{EN}$ to the write driver.

Figure 9:
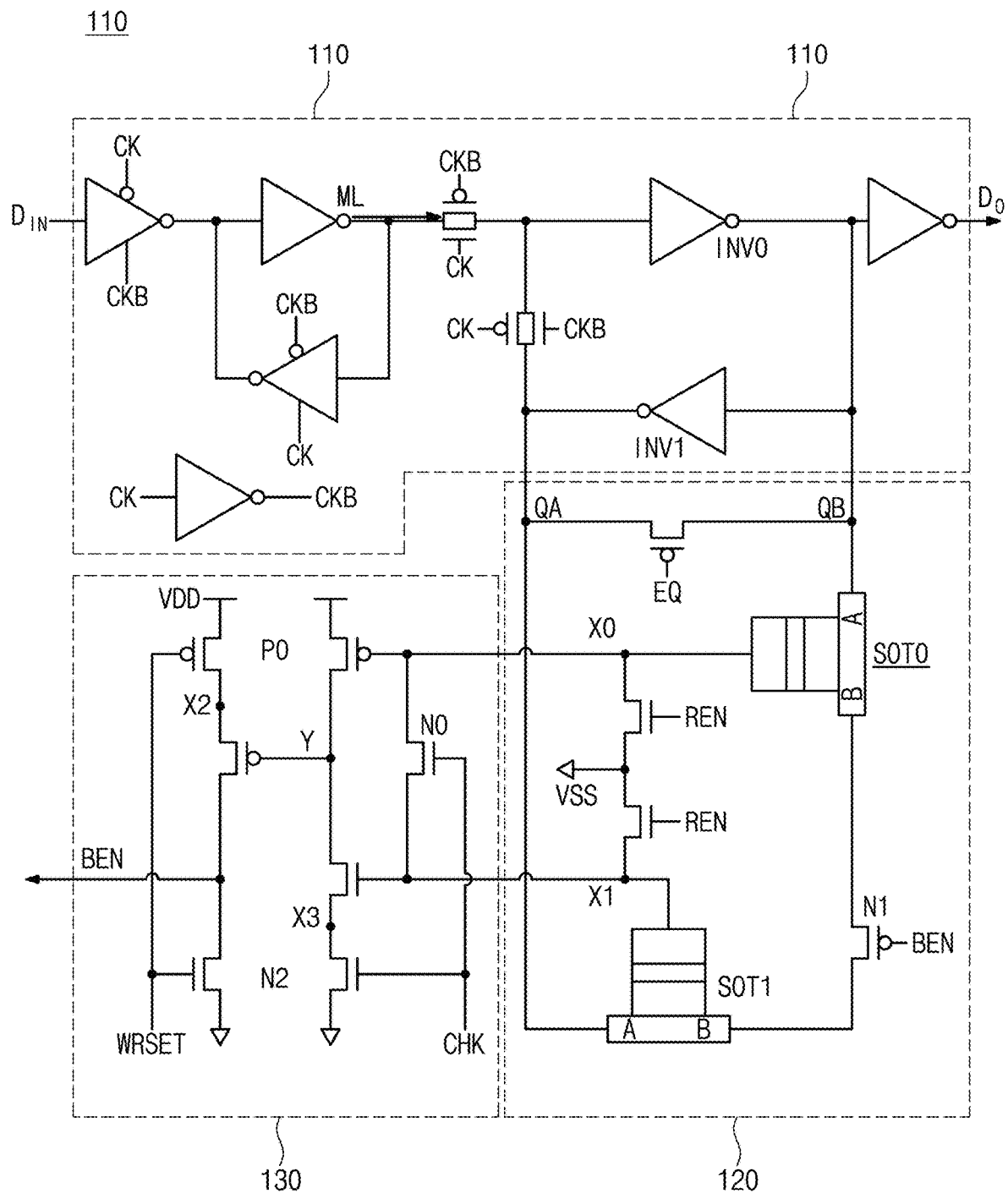
FIG. 9 is a diagram illustrating an embodiment of a flip-flop based on a nonvolatile memory of FIG. 1.
Figure 10:
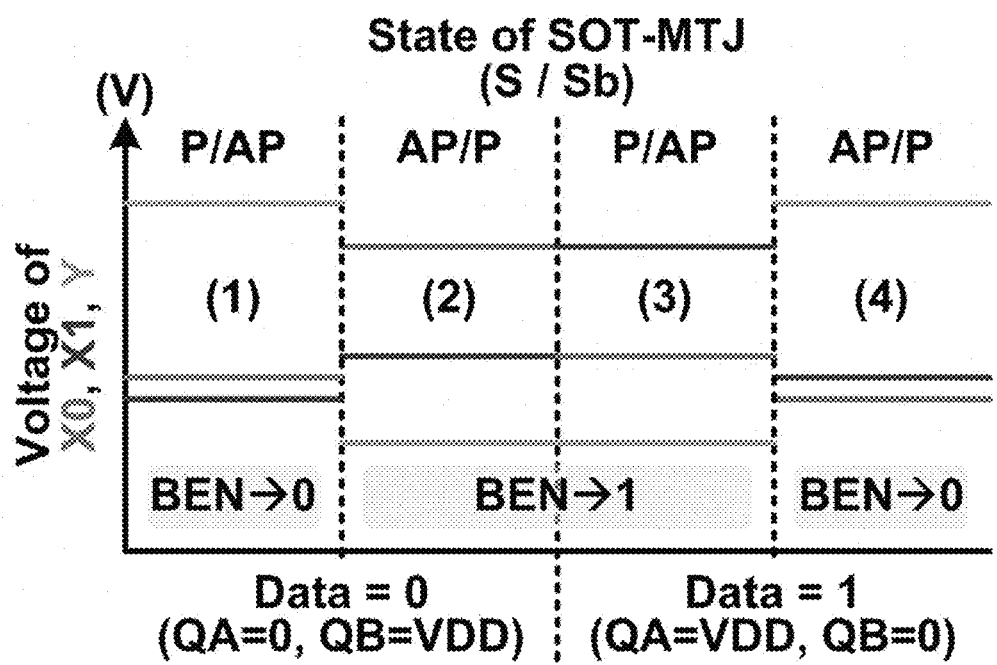
FIG. 10 is a diagram illustrating a state diagram of a flip-flop based on a nonvolatile memory.
Figure 11:
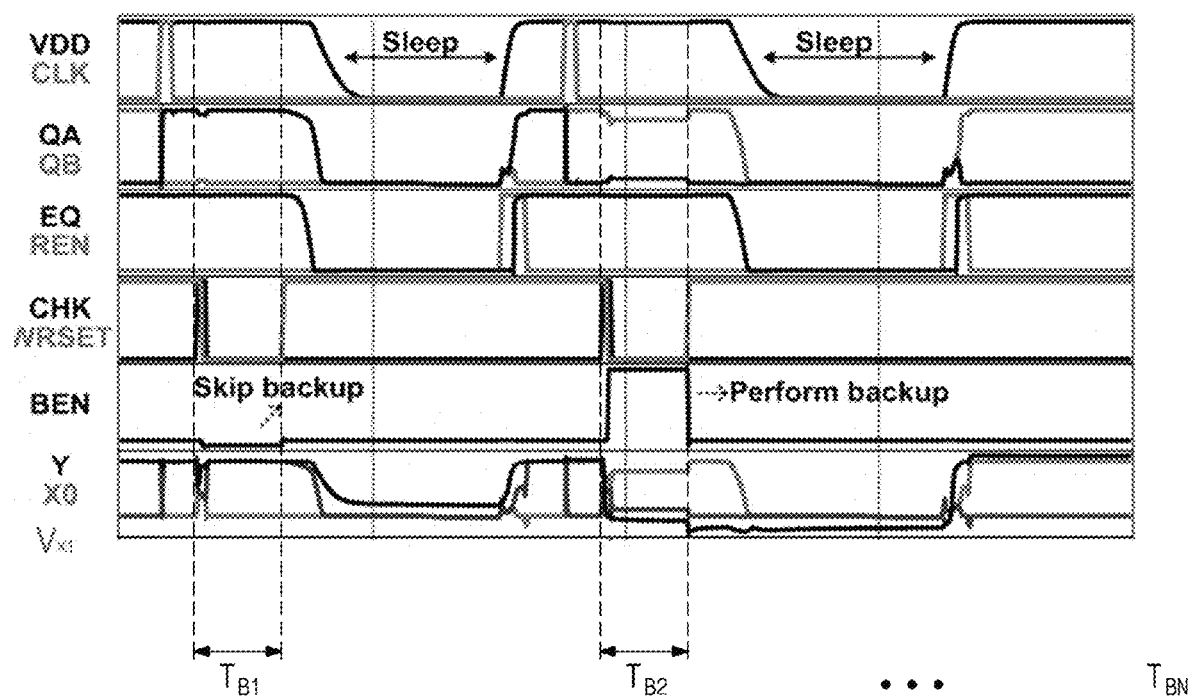
FIG. 11 is a diagram illustrating an operation timing of a flip-flop based on a nonvolatile memory of FIG. 1.

FIG. 9 is a diagram illustrating an embodiment of the flip-flop 100 based on a nonvolatile memory of FIG. 1, FIG. 10 is a diagram illustrating a state diagram of the flip-flop 100 based on a nonvolatile memory of FIG. 9, and FIG. 11 is a diagram illustrating an operation timing of the flip-flop 100 based on a nonvolatile memory of FIG. 9.

Referring to FIGS. 9 to 11, the flip-flop 100 based on a nonvolatile memory may have first to fourth operating states, based on whether the output data $D_O$ and the backup data $D_b$ are the same.

First, the flip-flop 100 based on a nonvolatile memory may not generate the backup activation signal $B_{EN}$ in a first operating state. Here, the first operating state may mean a state in which the first MTJ element 121_1 is a parallel state P, the second MTJ element 121_2 is an antiparallel state AP, and the first node voltage $V_{QA}$ is the ground voltage VSS, and the second node voltage $V_{QB}$ is the driving power supply VDD. That is, the first operating state may mean the state in which the output data $D_O$ and the backup data $D_b$ are equal to each other with a value of '0'.

In more detail, when the flip-flop 100 based on a nonvolatile memory is in the first operating state, the backup controller 130 may sense the voltage difference VD less than the preset voltage magnitude and generate the determination signal $V_Y$ as the high potential voltage signal. In this case, the backup controller 130 may not generate the backup activation signal $B_{EN}$, based on the determination signal $V_Y$ of the high potential. That is, as the backup operation is skipped in a $T_{B1}$ time illustrated in FIG. 11, the backup controller 130 may not output the backup activation signal $B_{EN}$.

In addition, the flip-flop 100 based on a nonvolatile memory may generate the backup activation signal $B_{EN}$ in a second operating state. Here, the second operating state may mean a state in which the first MTJ element 121_1 is the antiparallel state AP, the second MTJ element 121_2 is the parallel state P, the first node voltage $V_{QA}$ is the ground voltage VSS, and the second node voltage $V_{QB}$ is the driving power supply VDD. That is, the second operating state may mean the state in which the output data $D_O$ is '0' and the backup data $D_b$ is '1', which are not the same as each other.

In detail, when the flip-flop 100 based on a nonvolatile memory is in the second operating state, the backup controller 130 may sense the voltage difference VD equal to or greater than the preset voltage magnitude and generate the determination signal $V_Y$ as the low potential voltage signal. In this case, the backup controller 130 may output the backup activation signal $B_{EN}$, based on the determination signal $V_Y$ of the low potential. That is, as the backup operation is performed in a $T_{B2}$ time illustrated in FIG. 11, the backup controller 130 may output the backup activation signal $B_{EN}$.

In addition, the flip-flop 100 based on a nonvolatile memory may generate the backup activation signal $B_{EN}$ in a third operating state. Here, the third operating state may mean a state in which the first MTJ element 121_1 is the parallel state P, the second MTJ element 121_2 is the antiparallel state AP, the first node voltage $V_{QA}$ is the driving power supply VDD, and the second node voltage $V_{QB}$ is the ground voltage VSS. That is, the third operating state may mean the state in which the output data $D_O$ is '1' and the backup data $D_b$ is '0', which are not the same as each other.

In detail, when the flip-flop 100 based on a nonvolatile memory is in the third operating state, the sensing circuit unit 131 may sense the voltage difference VD equal to or greater than the preset voltage magnitude and generate the determination signal $V_Y$ as the low potential voltage signal. In this case, the signal generator 135 may output the backup activation signal $B_{EN}$ based on the determination signal $V_Y$ of the low potential. That is, as the backup operation is performed in the $T_{B2}$ time illustrated in FIG. 11, the backup controller 130 may output the backup activation signal $B_{EN}$.

In addition, the flip-flop 100 based on a nonvolatile memory may not generate the backup activation signal $B_{EN}$ in a fourth operating state. Here, the fourth operating state may mean a state in which the first MTJ element 121_1 is the antiparallel state AP, the second MTJ element 121_2 is the parallel state P, and the first node voltage $V_{QA}$ is the driving power supply VDD, and the second node voltage $V_{QB}$ is the ground voltage VSS. That is, the fourth operating state may mean the state in which the output data $D_O$ is '1' and the backup data $D_b$ is '1', which are the same as each other.

In detail, when the flip-flop 100 based on a nonvolatile memory is in the fourth operating state, the backup controller 130 may sense the voltage difference VD less than the preset voltage magnitude and generate the determination signal $V_Y$ as the high potential voltage signal. In this case, the backup controller 130 may not output the backup activation signal $B_{EN}$, based on the determination signal $V_Y$ of the high potential. That is, as the backup operation is skipped in the $T_{B1}$ time illustrated in FIG. 11, the backup controller 130 may not output the backup activation signal $B_{EN}$.

According to embodiments of the inventive concept, a flip-flop based on a nonvolatile memory and a backup operation method thereof, when output data and backup data are the same, may reduce power consumed for a backup operation, by skipping the backup operation.

The contents described above are specific embodiments for implementing the inventive concept. The inventive concept may include not only the embodiments described above but also embodiments in which a design is simply or easily capable of being changed. In addition, the inventive concept may also include technologies easily changed to be implemented using embodiments. Therefore, the scope of the inventive concept is not limited to the described embodiments but should be defined by the claims and their equivalents.

While the inventive concept has been described with reference to exemplary embodiments thereof, it will be apparent to those of ordinary skill in the art that various changes and modifications may be made thereto without departing from the spirit and scope of the inventive concept as set forth in the following claims.

What is claimed is:

1. A flip-flop based on a nonvolatile memory comprising:
   a flip-flop unit configured to output output data;
   a nonvolatile memory unit electrically connected to the flip-flop unit and configured to store backup data; and
   a backup controller configured to selectively control a backup operation for backing up the output data to the backup data, based on whether the backup data are the same as the output data, wherein the nonvolatile memory unit includes:
- a first magnetic tunnel junction (MTJ) element configured to receive a first node voltage corresponding to the output data from the flip-flop unit; and
- a second MTJ element configured to receive a second node voltage corresponding to the output data from the flip-flop unit, and wherein the backup controller includes:
- a sensing circuit unit connected in series between the first and second MTJ elements and configured to sense first and second sensing voltages divided from the first and second node voltages; and
- a signal generator configured to selectively output a backup activation signal, based on a voltage difference between the first and second sensing voltages.

2. The flip-flop based on the nonvolatile memory of claim 1, wherein the backup controller allows the backup operation to be skipped when the output data are the same as the backup data.

3. The flip-flop based on the nonvolatile memory of claim 1, wherein the sensing circuit unit generates a determination signal indicating whether the backup data are the same as the output data, based on the voltage difference between the first and second sensing voltages.

4. The flip-flop based on the nonvolatile memory of claim 3, wherein the sensing circuit unit generates the determination signal as a high potential voltage signal when the voltage difference between the first and second sensing voltages is less than a preset magnitude, and generates the determination signal as a low potential voltage signal when the voltage difference between the first and second sensing voltages is equal to or greater than the preset magnitude.

5. The flip-flop based on the nonvolatile memory of claim 4, wherein the signal generator generates the backup activation signal when the determination signal is the low potential voltage signal, and does not generate the backup activation signal when the determination signal is the high potential voltage signal.

6. The flip-flop based on the nonvolatile memory of claim 1, wherein the sensing circuit unit includes:
- a first sensing transistor positioned in series between the first and second MTJ elements;
- a second sensing transistor having a gate connected to a drain of the first sensing transistor;
- a third sensing transistor having a gate connected to a source of the first sensing transistor; and
- a fourth transistor positioned between a source of the third sensing transistor and a ground power source.

7. The flip-flop based on the nonvolatile memory of claim 6, wherein the first sensing transistor and the first and second MTJ elements are voltage dividing circuit that divides the first and second node voltages into the first and second sensing voltages.

8. The flip-flop based on the nonvolatile memory of claim 6, wherein the first sensing transistor connects the first and second MTJ elements to each other, based on a check signal, and the check signal corresponds to a falling edge of a write drive signal for driving a write driver.

9. The flip-flop based on the nonvolatile memory of claim 6, wherein the first sensing transistor is a PMOS transistor, and the second to fourth sensing transistors are NMOS transistors.

10. The flip-flop based on the nonvolatile memory of claim 6, wherein the signal generator includes:
- a first signal transistor having a gate connected to a determination node that is positioned between the second and third sensing transistors;
- a second signal transistor positioned between the first signal transistor and a driving power source; and
- a third signal transistor positioned between the first signal transistor and a driving power source.

11. The flip-flop based on the nonvolatile memory of claim 10, wherein the first signal transistor connects the second signal transistor to the third signal transistor, based on a determination signal applied through the determination node.

12. The flip-flop based on the nonvolatile memory of claim 10, wherein the first and second signal transistors are NMOS transistors, and the third signal transistor is a PMOS transistor.

13. The flip-flop based on the nonvolatile memory of claim 1, wherein the first and second MTJ elements are implemented as a resistive memory device of at least one of a spin-torque transfer (STT), a spin-orbit torque (SOT), a phase change RAM (PRAM), a nano floating gate memory (NFGM), a resistance RAM (ReRAM), a polymer RAM (PoRAM), a MRAM (magnetic RAM), and a molecular electronic device.

14. An operating method of a flip-flop based on a nonvolatile memory, the operating method comprising:
- outputting, by a flip-flop unit, output data;
- receiving, by a nonvolatile memory unit, first and second node voltages corresponding to the output data;
- determining, by a backup controller, whether the output data are the same as backup data stored in the nonvolatile memory unit, based on the first and second node voltages; and
- selectively outputting, by the backup controller, a backup activation signal, based on whether the output data are the same as the backup data, wherein the receiving further comprises:
- receiving, by a first magnetic tunnel junction (MTJ) element of the nonvolatile memory unit, the first node voltage from the flip-flop unit; and
- receiving, by a second MTJ element of the nonvolatile memory unit, the second node voltage from the flip-flop unit, and wherein the determining comprises:
- sensing first and second sensing voltages of which the first and second node voltages are divided through a first sense transistor connected in series between the first and second MTJ elements; and
- generating a determination signal indicating whether the output data are the same as the backup data, based on a voltage difference between the first and second sensing voltages.

15. The operating method of claim 14, wherein the generating of the determination signal includes:
- generating the determination signal as a high potential voltage signal when the voltage difference between the first and second sensing voltages is less than a preset voltage magnitude; and
- generating the determination signal as a low potential voltage signal when the voltage difference between the first and second sensing voltages is equal to or greater than the preset voltage magnitude.

16. The operating method of claim 14, wherein the selectively outputting of the backup activation signal includes:

outputting the backup activation signal when the determination signal is a high potential; and non-outputting the backup activation signal when the determination signal is a low potential.

* * * * *